United States Patent [19]

Grah

[11] Patent Number: 4,512,854
[45] Date of Patent: Apr. 23, 1985

[54] METHOD OF ELECTROPLATING PRINTED CIRCUITS

[75] Inventor: Klaus Grah, Solingen, Fed. Rep. of Germany

[73] Assignee: Beiersdorf AG, Hamburg, Fed. Rep. of Germany

[21] Appl. No.: 546,217

[22] Filed: Oct. 27, 1983

[30] Foreign Application Priority Data

Nov. 2, 1982 [DE] Fed. Rep. of Germany ....... 3240387

[51] Int. Cl.$^3$ .............................................. C25D 5/02
[52] U.S. Cl. ...................................... 204/15; 204/279
[58] Field of Search .................... 204/15, DIG. 7, 16, 204/17, 18.1, 279, 224 R; 174/118

[56] References Cited

U.S. PATENT DOCUMENTS 2,834,723  5/1958  Robinson .............................. 204/15
4,000,045  12/1976  Rotzow .................................. 204/15

OTHER PUBLICATIONS

IBM Tech. Disclosure Bulletin, vol. 2, No. 3, Oct. 1959, p. 32.

*Primary Examiner*—Thomas Tufariello
*Attorney, Agent, or Firm*—John C. Smith, Jr.

[57] ABSTRACT

A process for electroplating a printed circuit board utilizing an improved masking tape for partially covering the surfaces of the circuit board is provided. The masking tape comprises a foil-like carrier and a coating consisting of an adhesive material applied to one side of the foil-like carrier. At least one electrical conductor is arranged on the coating of the masking tape and forms a unit therewith. The electrical conductor connects the surfaces to be electroplated of the printed circuit board with one another and with a frame carried by the printed circuit board.

6 Claims, 2 Drawing Figures

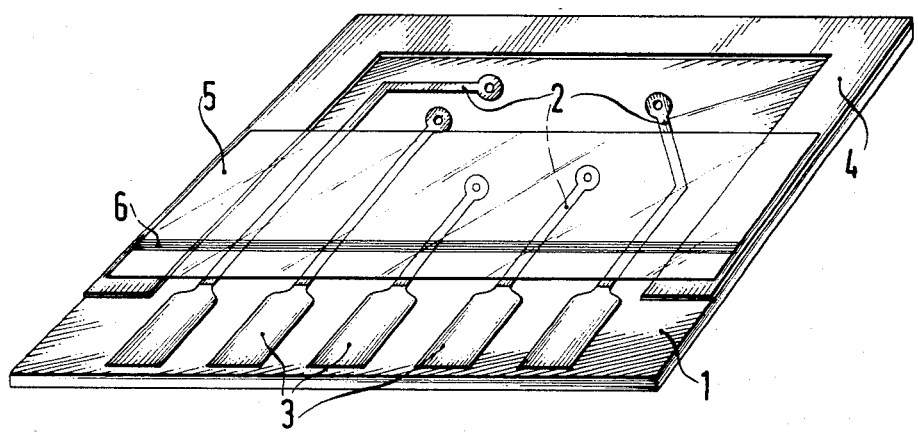
FIG. 1
FIG. 2
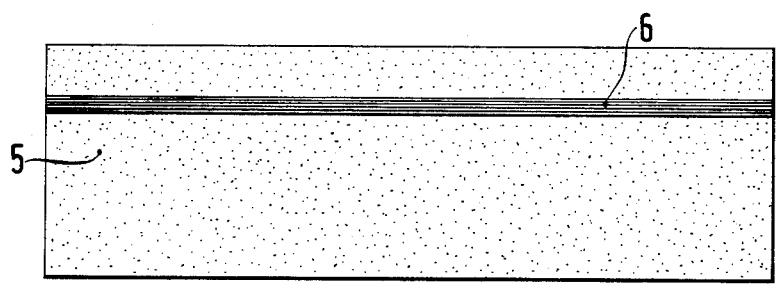

METHOD OF ELECTROPLATING PRINTED CIRCUITS

BACKGROUND OF THE INVENTION

This invention relates to an improved process for electroplating a printed circuit board wherein the surfaces of the circuit board are partially covered with a masking tape comprising a foil-like carrier of paper or plastic and a coating of an adhesive material applied to one side of the carrier and being self-adhesive or adhered by means of a heat activation process.

Masking tapes of this kind are known and serve the purpose of keeping predetermined surfaces of printed circuit boards to be electroplated free from deposits. For this purpose, these surfaces are covered by the masking tape. The known masking tapes have, however, substantial disadvantages which will be explained below. If the surfaces of the printed circuit board to be electroplated have no electrical connection to the electroplating cathode, the connection of the surfaces to be electroplated with one another and with the electroplating cathode must be made by additional conducting paths, in that, for example in the case of printed circuit boards with plug connectors to be gold-plated, each plug connector is electrically connected by means of a conducting path additionally produced on the printed circuit board to a conducting path extending along the plug connectors and being likewise produced on the printed circuit board, the latter conducting path being electrically connected to the frame of the printed circuit board which is connected to the electroplating cathode. The production of the additional conducting path is, however, expensive as regards the required time and labor. In addition, the electroplating process results in a useless gold-plating of the additional conducting paths. Finally, it cannot be avoided that the copper layer provided on the printed circuit board is bare at those points at which during the separation of the frame from the printed circuit board the individual additional conducting paths are detached from the plug connectors. The copper layer will be affected at these points by influences of the environment.

SUMMARY OF THE INVENTION

It is, therefore, the object of the present invention to provide a masking tape for electroplating processes of the kind mentioned above the use of which makes it possible to dispense with the additional conducting paths on the printed circuit board which were necessary up to now, thus avoiding the disadvantages resulting from the additional conducting paths.

To attain this object the present invention provides a masking tape for partially covering the surfaces of an object, particularly a printed circuit board, to be electroplated by an electroplating process, said masking tape comprising a foil-like carrier, a coating consisting of an adhesive material applied to one side of the foil-like carrier, at least one electrical conductor arranged on the coating of the masking tape and forming a unit therewith, and a frame carried by the printed circuit board, said electrical conductor connecting the surfaces to be electroplated of the printed circuit board with one another and with the frame carried by the printed circuit board.

The foil-like carrier may consist of paper or plastic.

In an advantageous embodiment the electrical conductor of the masking tape consists of a mixture of varnish and metal powder.

In another advantageous embodiment the electrical conductor of the masking tape consists of a strip-shaped metal foil.

BRIEF DESCRIPTION OF THE DRAWING

An embodiment of the invention will now be described by way of example and with reference to the accompanying drawing in which:

FIG. 1 is a plan view of a printed circuit board with a masking tape according to the invention, and FIG. 2 is a plan view of the side of the masking tape provided with a coating.

DESCRIPTION OF THE PREFERRED EMBODIMENT

FIG. 1 shows a printed circuit board 1 having conducting paths 2, plug connectors 3 and a frame 4. The printed circuit board 1 and the frame 4 thereof are partially covered by a transparent masking tape 5 which is provided on that side with which it sticks to the printed circuit board 1 with a coating of an adhesive material which may be self-adhesive. It is, however, also possible to apply the coating to the foil-like carrier by a heat activation process. The masking tape 5 is in the form of a foil-like carrier consisting of paper, plastic or the like.

The masking tape 5 carries on its coating one or more electrical conductors 6 which form a unit with the masking tape 5. The electrical conductor 6 of the masking tape 5 consists of a mixture of varnish and metal powder or of a strip-shaped metal foil. Instead of metal powder also graphite or carbon black may be used. After the masking tape 5 has been applied to the printed circuit board 1 and the frame 4 thereof, the conducting paths 2 of the printed circuit board 1 and thus the surfaces to be electroplated are electrically connected with one another and with the frame 4 by means of the electrical conductor 6.

The invention may be embodied in other specific forms without departing from the spirit or essential characteristics thereof. The embodiment is therefore to be considered in all respects as illustrative and not restrictive. For instance:

The invention is of course not restricted to the use with printed circuit boards but may also be used for partially covering other objects that are to be electroplated.

What is claimed is:

1. In a process for electroplating a printed circuit board, the improvement comprising partially covering the surfaces of said printed circuit board with a masking tape, said masking tape comprising
   (a) a foil-like carrier;
   (b) a coating consisting of an adhesive material applied to one side of the foil-like carrier;
   (c) at least one electrical conductor arranged on the coating of the masking tape and forming a unit therewith, said electrical conductor consisting of a mixture of varnish and metal powder; and
   (d) a frame carried by the printed circuit board, said electrical conductor connecting the surfaces to be electroplated of the printed circuit board with one another and with the frame carried by the printed circuit board.

2. An electroplating process as claimed in claim 1, wherein the foil-like carrier consists of paper.

3. An electroplating process as claimed in claim 1, wherein the foil-like carrier consists of plastic.

4. An electroplating process as claimed in claim 1, wherein the adhesive material is self-adhesive.

5. An electroplating process as claimed in claim 1, wherein the applying of the coating to the foil-like carrier is effected by a heat activation process.

6. In a process for electroplating a printed circuit board, said printed circuit board having a frame electrically isolated from surfaces on said printed circuit board to be electroplated, the improvement comprising partially covering surfaces on said printed circuit board with a masking tape, said masking tape comprising (a) a foil-like carrier;
(b) a coating consisting of an adhesive material on one side of the foil-like carrier, said adhesive material having been applied to said foil-like carrier by a heat activation process; and
(c) at least one electrical conductor arranged on the coating of the masking tape and forming a unit therewith, said electrical conductor consisting of a mixture of varnish and metal powder;

said electrical conductor connecting the surfaces to be electroplated of the printed circuit board with one another and with the frame carried by the printed circuit board.

* * * * *